(12) United States Patent
Lin et al.

(10) Patent No.: US 7,928,655 B2
(45) Date of Patent: Apr. 19, 2011

(54) LIGHT-EMITTING DIODE DEVICE AND METHOD FOR FABRICATING THE SAME

(75) Inventors: Tzu-Han Lin, Hsinchu (TW); Tzy-Ying Lin, Hsinchu (TW); Jui-Ping Weng, Miaoli (TW); Wei-Hung Kang, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 86 days.

(21) Appl. No.: 12/267,872

(22) Filed: Nov. 10, 2008

(65) Prior Publication Data

US 2010/0117530 A1 May 13, 2010

(51) Int. Cl.
*H05B 33/04* (2006.01)
(52) U.S. Cl. ............... 313/512; 257/99; 257/100
(58) Field of Classification Search .......... 313/498, 313/502, 512, 503, 509; 257/98, 99, 100; 438/28
See application file for complete search history.

(56) References Cited

U.S. PATENT DOCUMENTS

| | | | |
|---|---|---|---|
| 2005/0051782 A1* | 3/2005 | Negley et al. | 257/79 |
| 2005/0093430 A1* | 5/2005 | Ibbetson et al. | 313/501 |
| 2007/0120463 A1* | 5/2007 | Hayashi et al. | 313/501 |
| 2008/0049430 A1* | 2/2008 | Sakumoto | 362/296 |

* cited by examiner

*Primary Examiner* — Joseph L Williams
*Assistant Examiner* — Andrew J Coughlin
(74) *Attorney, Agent, or Firm* — Muncy, Geissler, Olds & Lowe, PLLC

(57) ABSTRACT

A light-emitting diode (LED) device is disclosed. The LED device includes a semiconductor substrate with a planar top surface, a light-emitting diode (LED) chip disposed over the top surface of the semiconductor substrate, at least two isolated outer wiring layers formed through the semiconductor substrate and electrically connected to the light-emitting diode chip, serving as input terminals, a transparent encapsulating layer with a substantially planar top surface formed over the semiconductor substrate, capping the LED chip and the at least two isolated outer wiring layers, and a lens module adhered to the substantially planar top surface of the transparent encapsulating layer to cap the light-emitting diode chip. In one embodiment, the lens module includes a fluorescent layer and a lens covering or covered by the fluorescent layer.

8 Claims, 23 Drawing Sheets

US 7,928,655 B2

LIGHT-EMITTING DIODE DEVICE AND METHOD FOR FABRICATING THE SAME

BACKGROUND OF THE INVENTION

1. Field of the Invention

The invention relates to a light-emitting diode (LED) device and more particularly to LED devices with a lens module having a fluorescent material and methods for fabricating the same.

2. Description of the Related Art

Light-emitting diode (LED) devices are solid-state light sources and have been known for years. The LED devices are based on the recombination of electron-hole pairs in a pn-junction in a semiconductor material which is forward-biased. Advantages of LED devices compared with traditional lamps are lower power consumption and longer lifespan. In particular, because white light LED devices have high color rendering index (CRI), it has become one of the most popular illuminating devices used.

A white light LED device can be obtained by mixing red, green, and blue lights using a combination of a red light LED chip (or die), a green light LED chip, and a blue light LED chip to form the white light LED device. However, the above three-in-one white light LED device is expensive because it requires three LED chips for different emitted lights. Moreover, the CRI is reduced due to different light-emitting efficiencies for each of the three LED chips.

In order to address the above drawbacks, a white light LED device has been developed by using a combination of a blue light LED device with a fluorescent material, such as a phosphor material. The blue light passes through the fluorescent red and green phosphor material, such that the combination of blue, red, and green lights produces a white light. Currently, such a white light LED device is formed by filling an epoxy resin containing phosphors around a blue light LED chip and then a lens is capped thereon. However, poor thickness uniformity of the epoxy resin containing phosphors filled around the blue light LED chip reduces the light-emitting properties of the LED devices and with direct contact between the epoxy resin and the LED chip, difficulty for rework performed to fill in the epoxy resin containing phosphors increases. Another method to form the white light LED device is to form a lens on a blue light LED chip followed by coating an epoxy resin layer containing phosphors thereon and covering the lens with a transparent protective resin or glue. However, the coating rate of the epoxy resin layer is slow and the manufacturing cost is high. Similarly, direct contact between the epoxy resin and the LED chip increases difficulty for rework performed to fill in the epoxy resin containing phosphors.

Therefore, there is a need to develop a novel LED device capable of addressing the above problems.

BRIEF SUMMARY OF THE INVENTION

A detailed description is given in the following embodiments with reference to the accompanying drawings. A light-emitting diode (LED) device and a method for fabricating the same are provided. An embodiment of an LED device comprises a semiconductor substrate with a planar top surface, a light-emitting diode (LED) chip disposed over the top surface of the semiconductor substrate, and at least two isolated outer wiring layers are formed through the semiconductor substrate and electrically connected to the light-emitting diode chip, serving as input terminals. Additionally, a transparent encapsulating layer with a substantially planar top surface is formed over the semiconductor substrate, capping the LED chip and the at least two isolated outer wiring layers, and a lens module is adhered to the substantially planar top surface of the transparent encapsulating layer to cap the light-emitting diode chip. In one embodiment, the lens module comprises a fluorescent layer and a lens covering or covered by the fluorescent layer.

An embodiment of a method for fabricating an LED device comprises providing a semiconductor substrate with a planar top surface. A plurality of light-emitting diode chips is formed over the top surface of the semiconductor substrate. The LED chips are capped with a transparent encapsulating layer, wherein the transparent encapsulating layer has a substantially planar top surface. The light-emitting diode chips are capped with a plurality of lens modules. A bottom surface of the semiconductor substrate between the adjacent LED chips is etched to form individual LED devices. In one embodiment, the lens modules comprise a fluorescent layer formed over a portion of the substantially planar top surface of the transparent encapsulating layer, respectively facing one of the light-emitting diode chips, and a lens covering or covered by the fluorescent layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
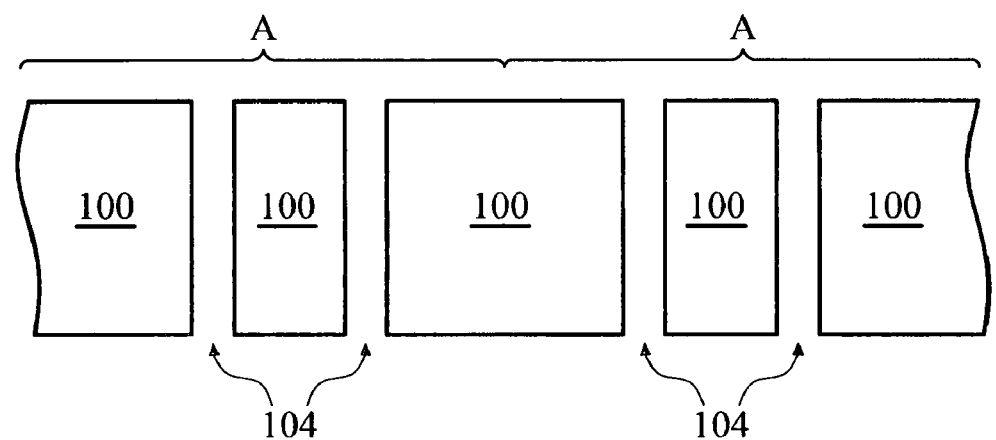
FIGS. 1A to 1I are cross sections of an exemplary embodiment of a method for fabricating LED devices according to the invention.
Figure 1B:
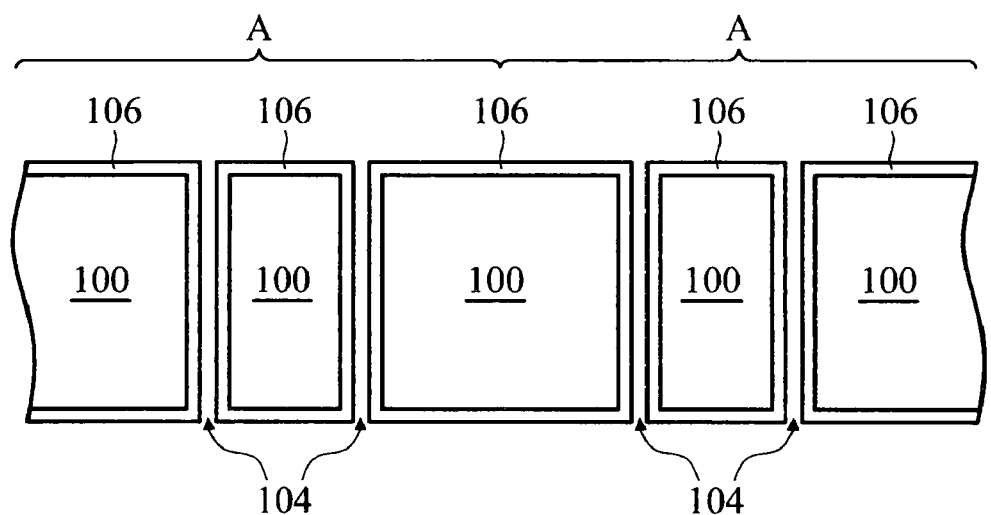
Figure 1C:
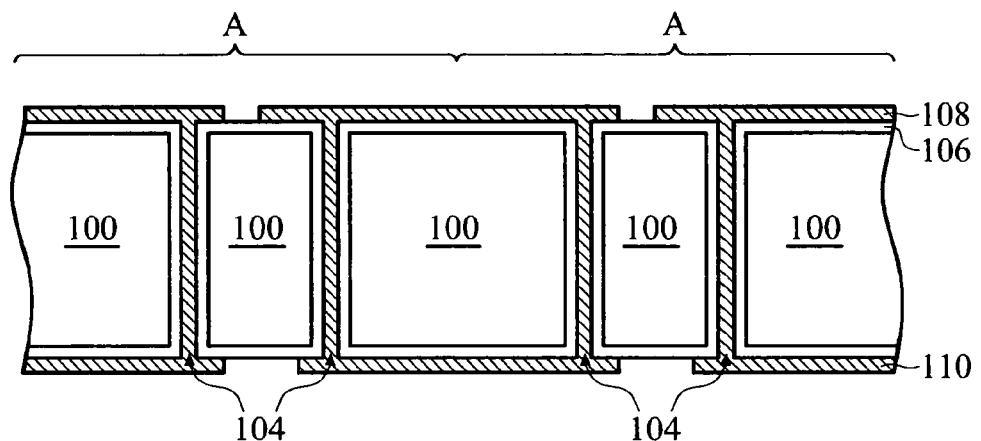
Figure 1D:
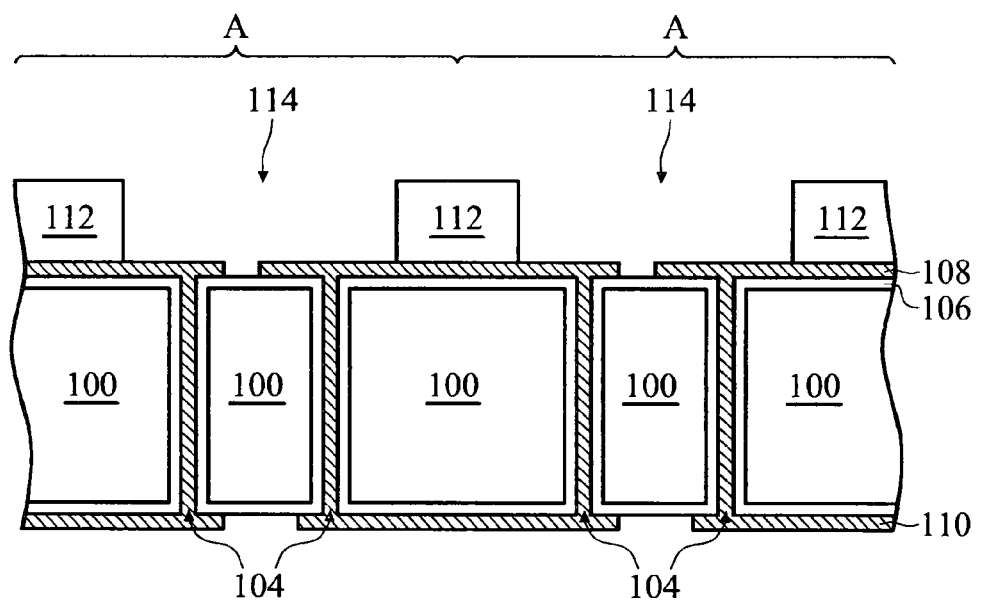
Figure 1E:
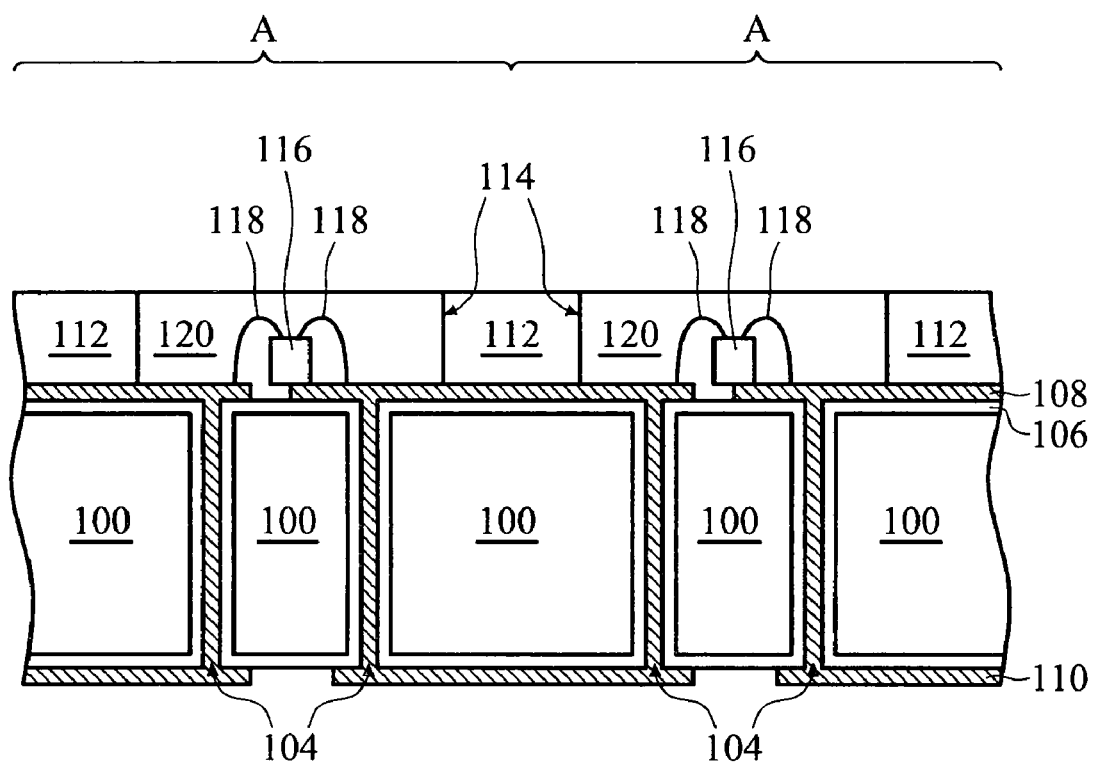
Figure 1F:
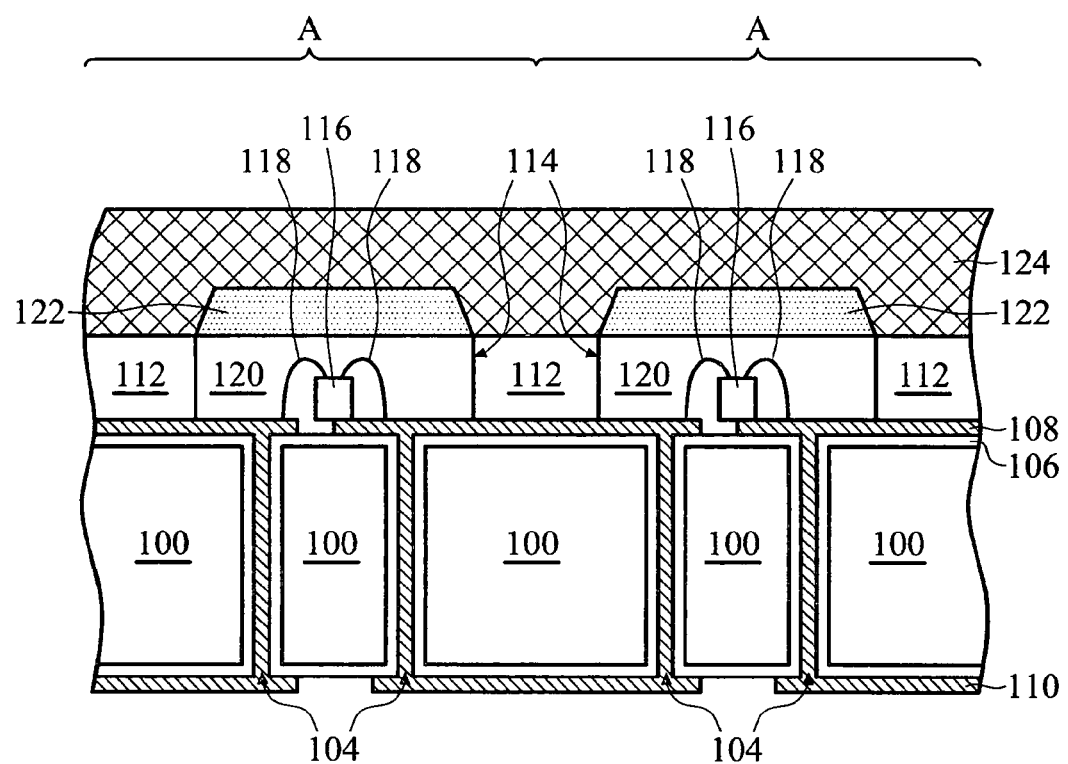
Figure 1G:
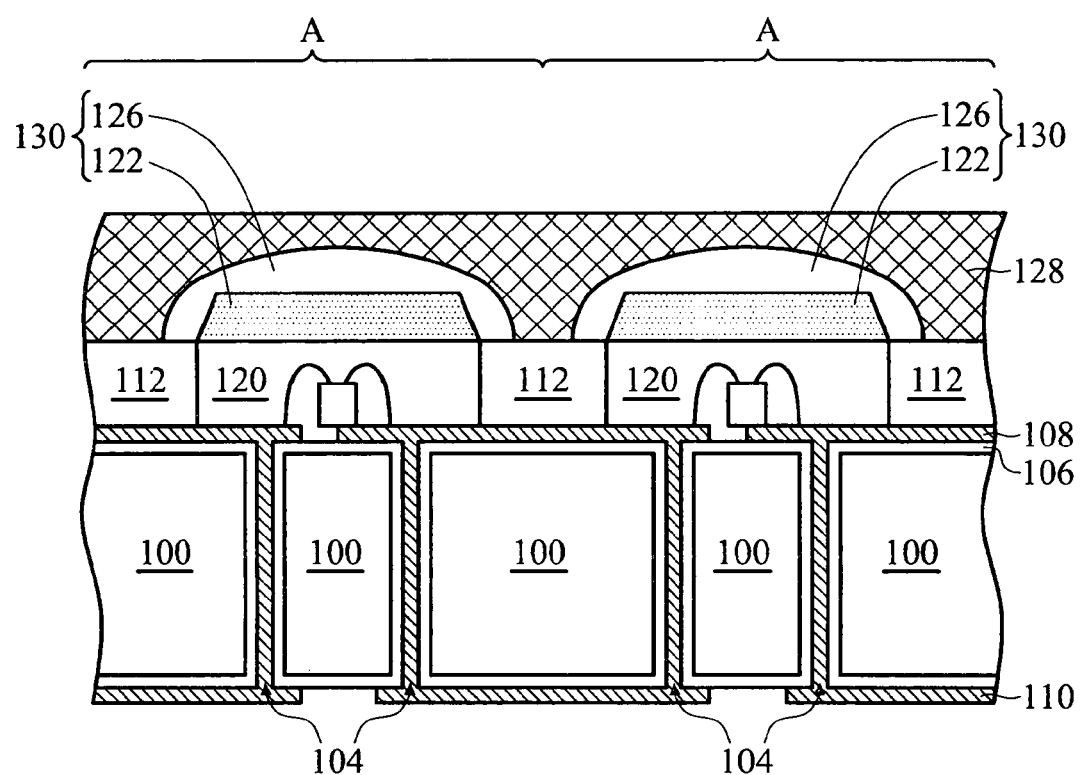
Figure 1H:
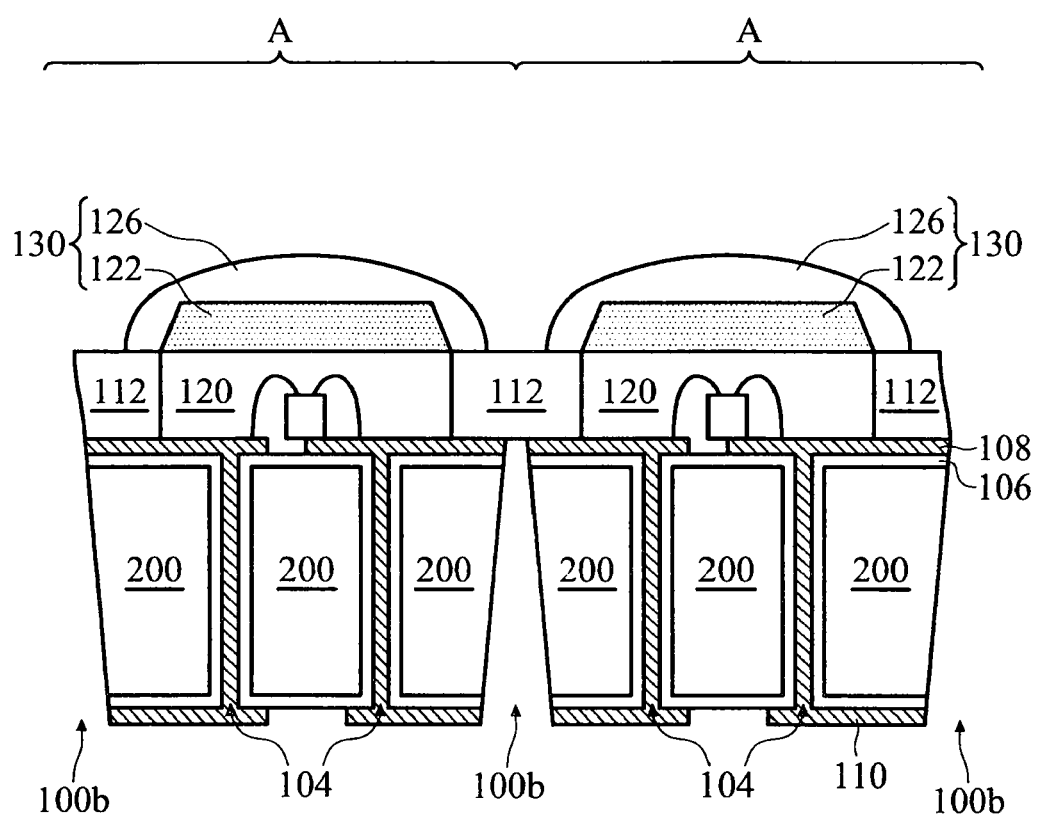
Figure 1I:
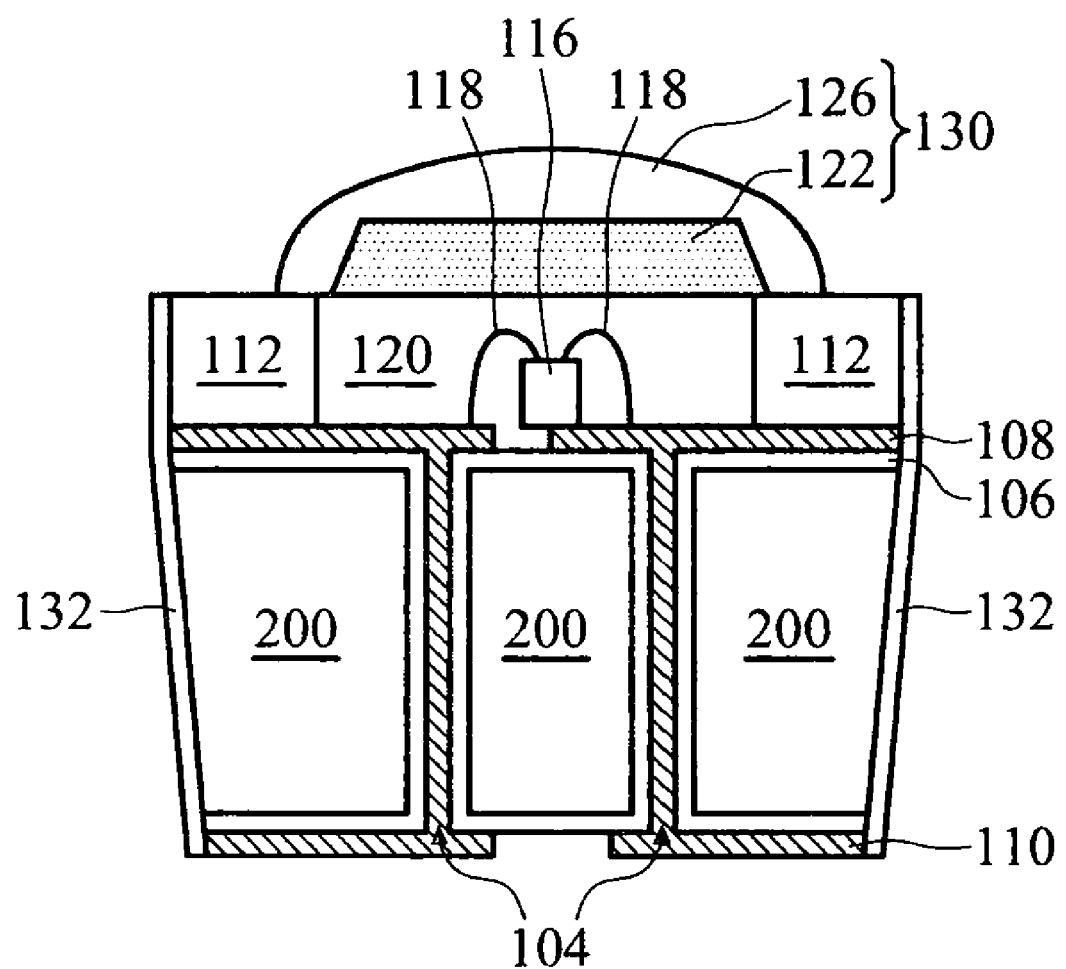

FIGS. 1I, 2C, 3E, 4D, 5B and 6B, are cross sections of various exemplary embodiments of LED devices according to the invention, respectively. Elements in FIGS. 2C, 3E, 4D, 5B and 6B that are the same as those in FIG. 1I are labeled with the same reference numbers as in FIG. 1I and are not described again for brevity. Referring to FIG. 1I, the LED device comprises a semiconductor substrate 200, such as a silicon substrate or other semiconductor substrates well known in the art, having a planar top surface. The semiconductor substrate 200 may contain a variety of elements, including, for example, transistors, resistors, and other semiconductor elements well known in the art. In order to simplify the diagram, the variety of elements is not depicted. At least two isolated inner wiring layers 108 are disposed over the semiconductor substrate 200. A light-emitting diode (LED) chip 116, such as a blue light LED chip (or die), is disposed over the top surface of the semiconductor substrate 200 and is electrically connected to the inner wiring layers 108 by wire bonding through wiring lines 116. In another embodiment, the LED chip 116 can be electrically connected to the inner wiring layers 108 by a conductive redistribution layer 166, as shown in 4D, 5B and 6B. At least two isolated outer wiring layers 110 are disposed on the bottom surface of the semiconductor substrate 200, serving as input terminals. In the embodiment, the outer wiring layers 110 are formed through the bottom portion the semiconductor substrate 200 and the inner wiring layers 108 are formed through the upper portion of the semiconductor substrate 200, such that the outer wiring layers 110 are directly connected to the inner wiring layers 108, respectively, so as to be electrically connected to the LED chip 116. A transparent encapsulating layer 120 is provided to cap the LED chip 116, having a substantially planar surface. A lens module 130 is adhered to the top surface of the transparent encapsulating layer 120, to cap the LED chip 116.

Figure 4A:
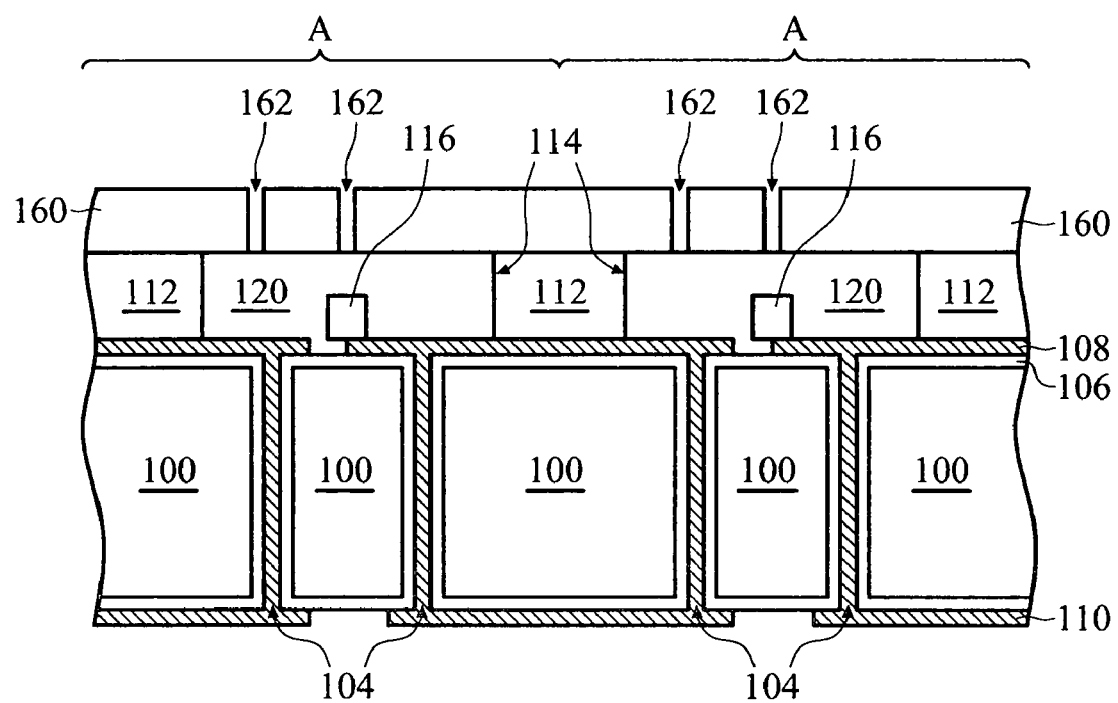
FIGS. 4A to 4D are cross sections of an exemplary embodiment of another method for fabricating LED devices according to the invention.
Figure 4B:
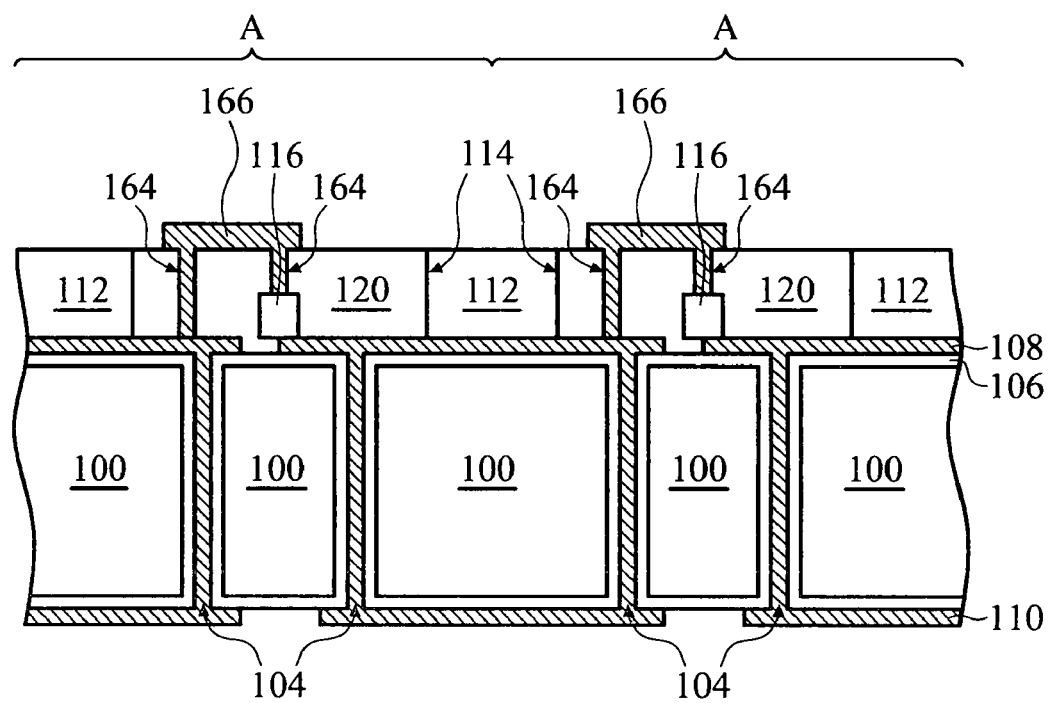
Figure 4C:
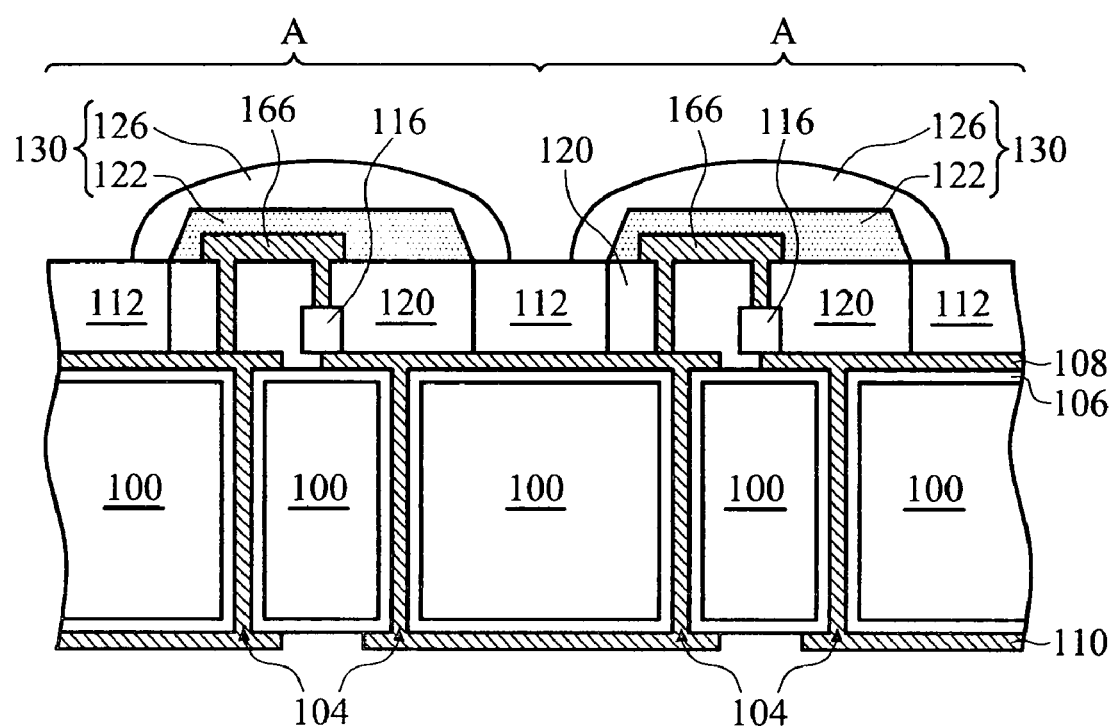
Figure 4D:
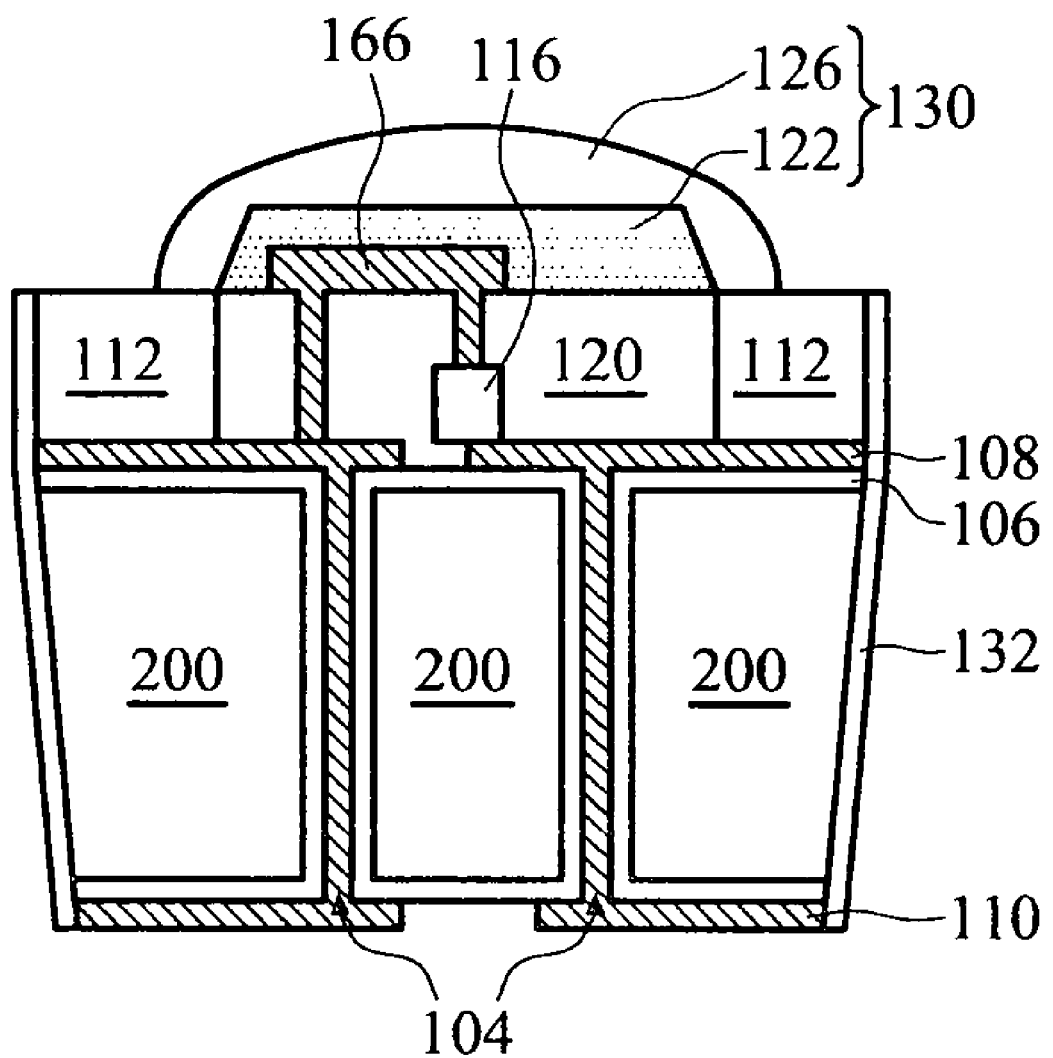

In the embodiments as shown in FIGS. 1I and 4D, the lens module 130 comprises a molded lens 126, and a molded fluorescent layer 122 covered by the molded lens 126, both facing the LED chip 101.

Figure 2A:
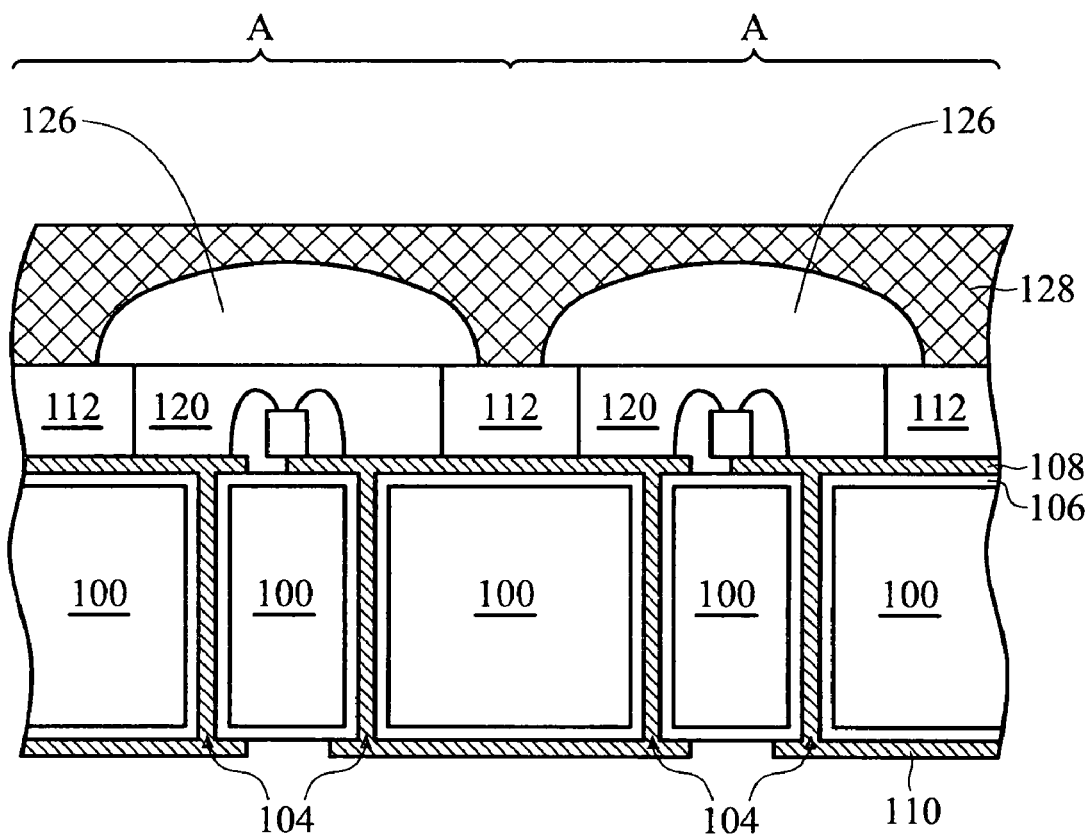
FIGS. 2A to 2C are cross sections of an exemplary embodiment of another method for fabricating LED devices according to the invention.
Figure 2B:
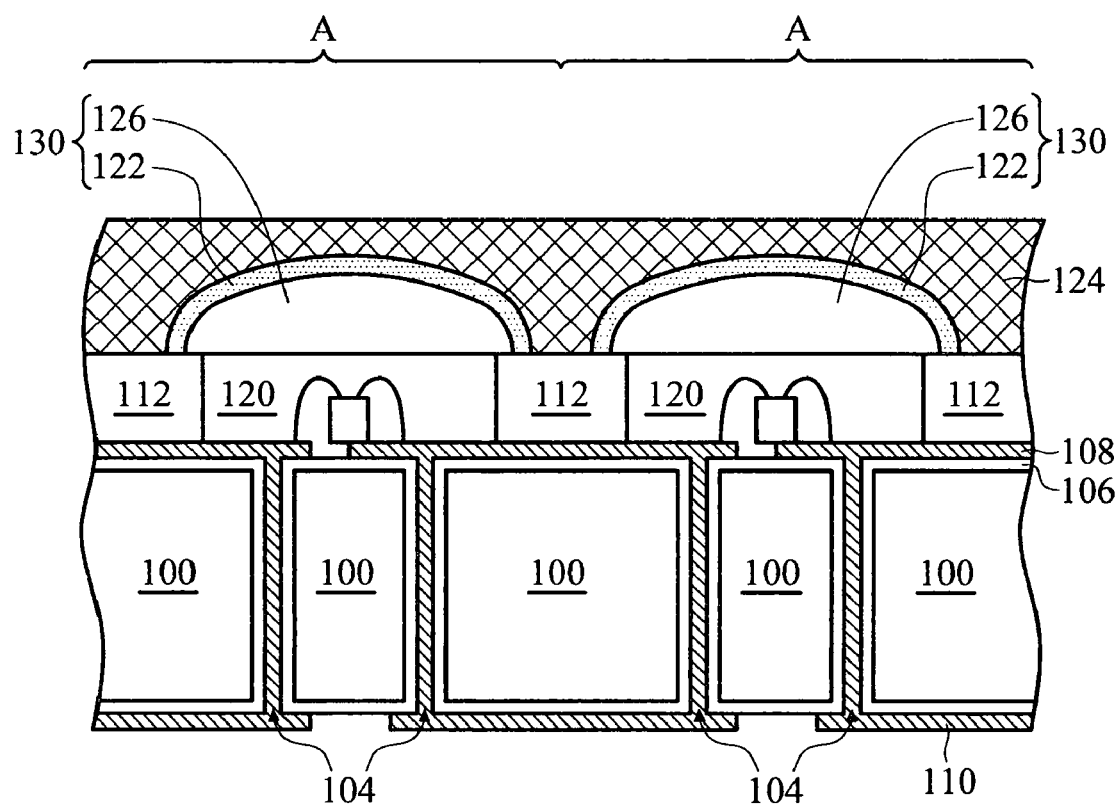
Figure 2C:
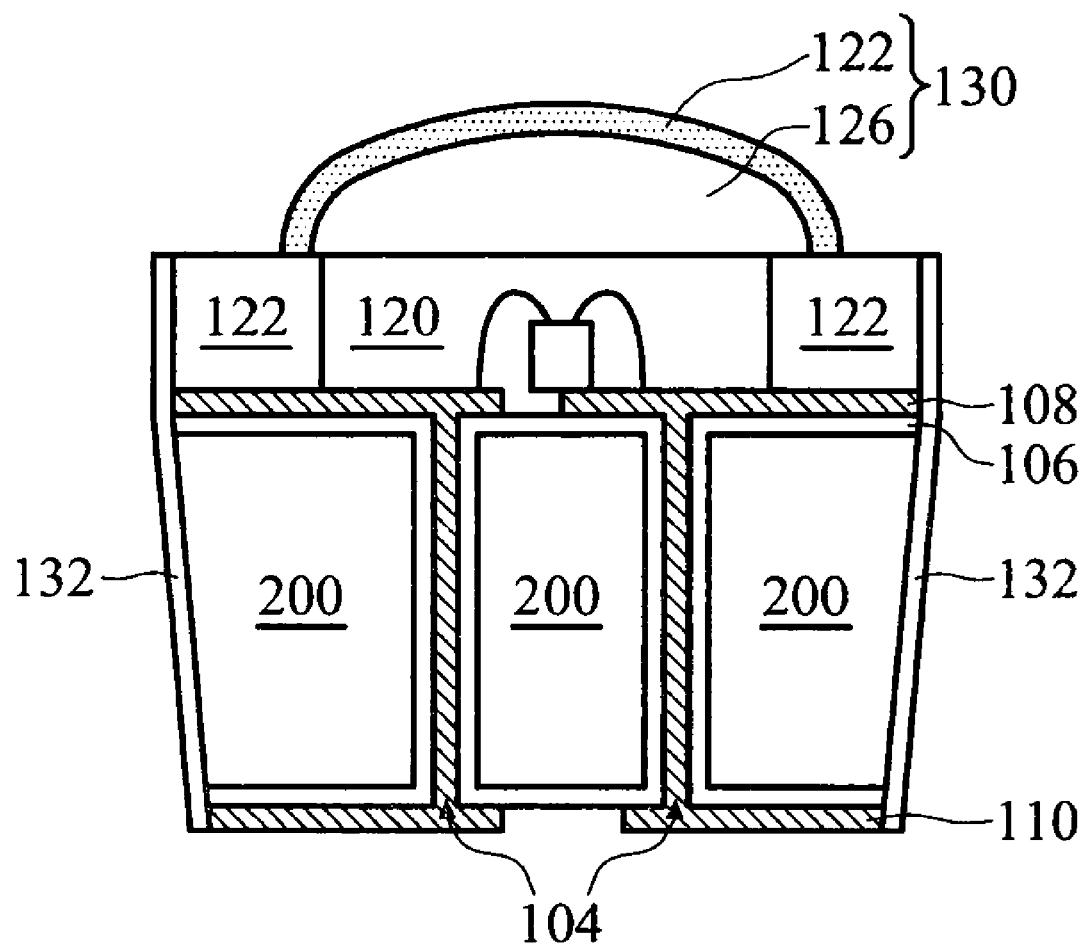
Figure 5A:
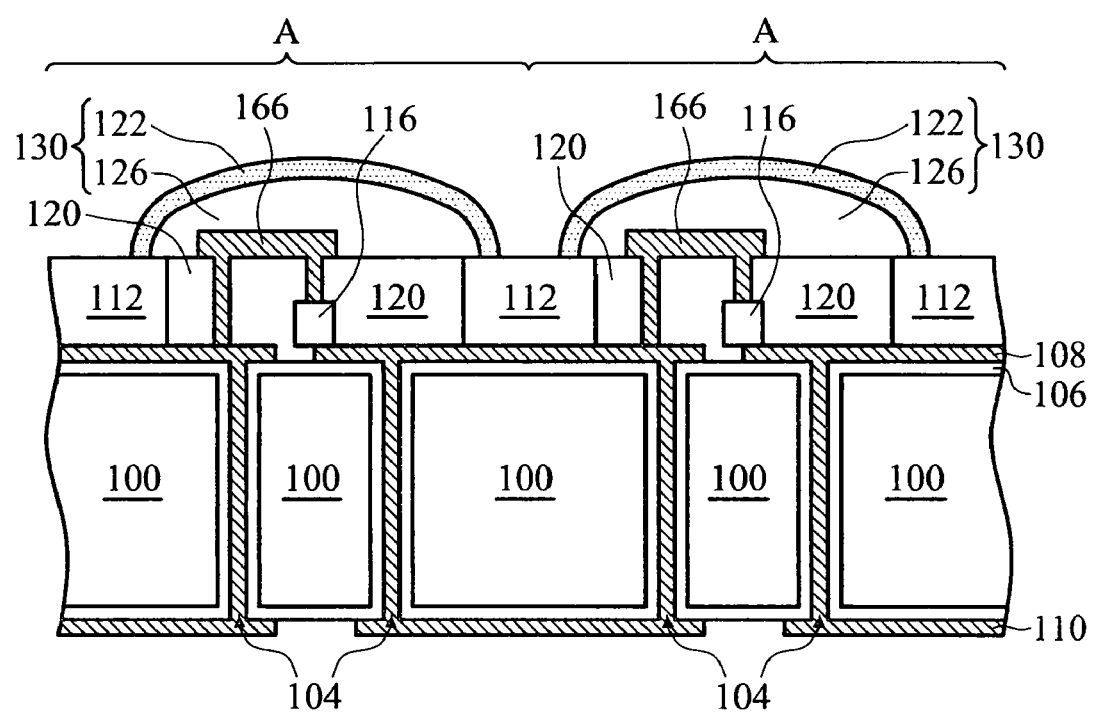
FIGS. 5A to 5B are cross sections of an exemplary embodiment of yet another method for fabricating LED devices according to the invention.
Figure 5B:
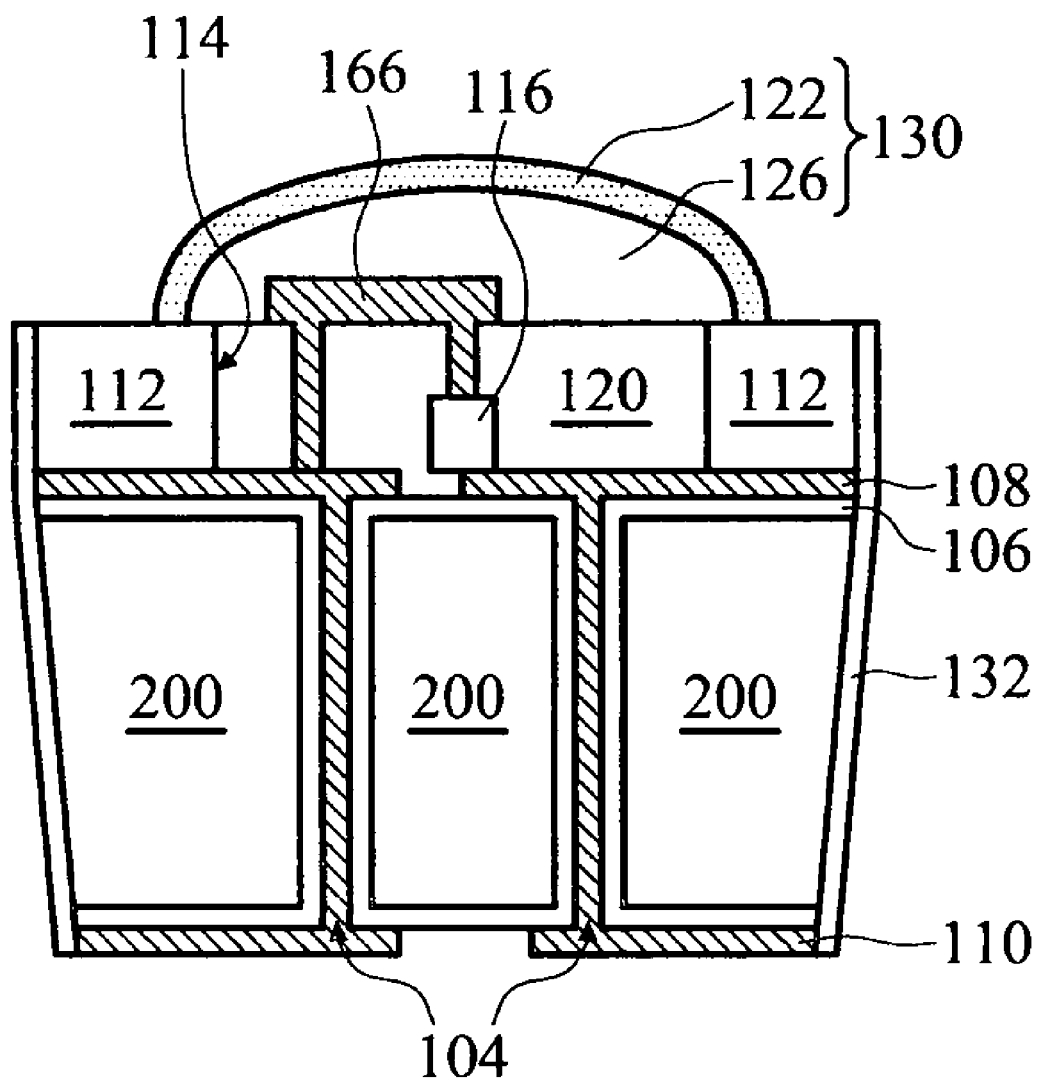

Referring to FIG. 2C and FIG. 5B, unlike the LED device shown in FIGS. 1I and 4D, the lens module 130 comprises a molded lens 126, and a molded fluorescent layer 122 covering the molded lens 126, both facing the LED chip 101.

Figure 3A:
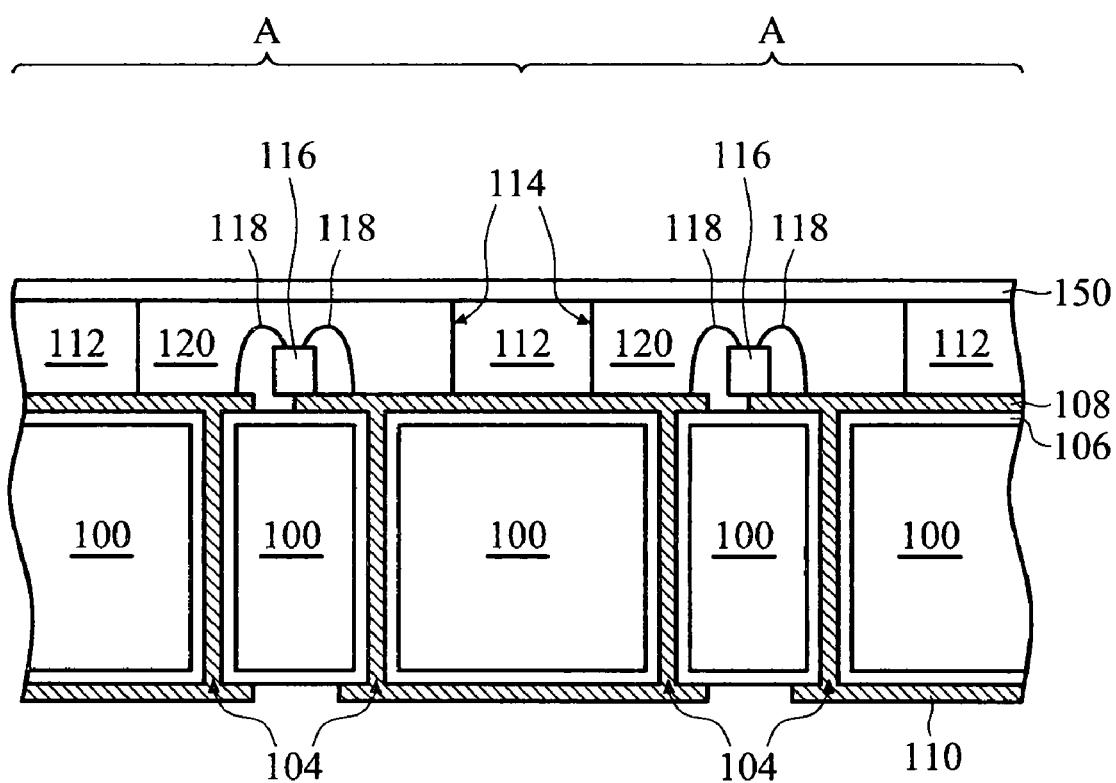
FIGS. 3A to 3E are cross sections of an exemplary embodiment of yet another method for fabricating LED devices according to the invention.
Figure 3B:
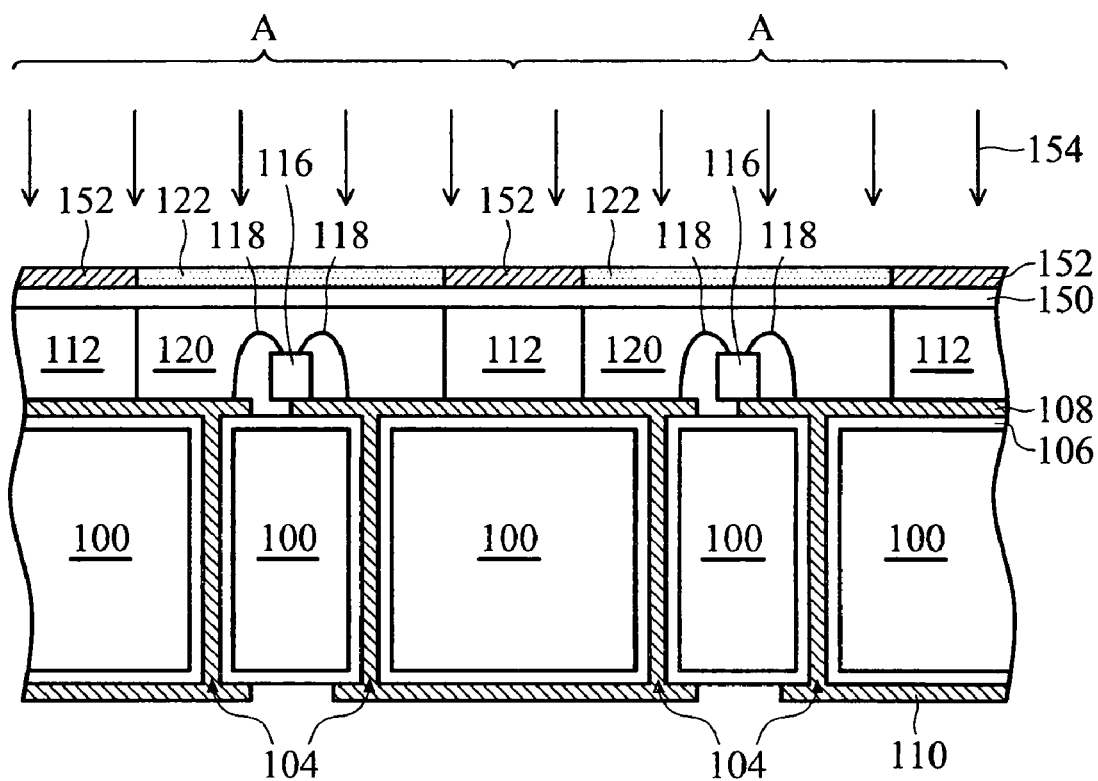
Figure 3C:
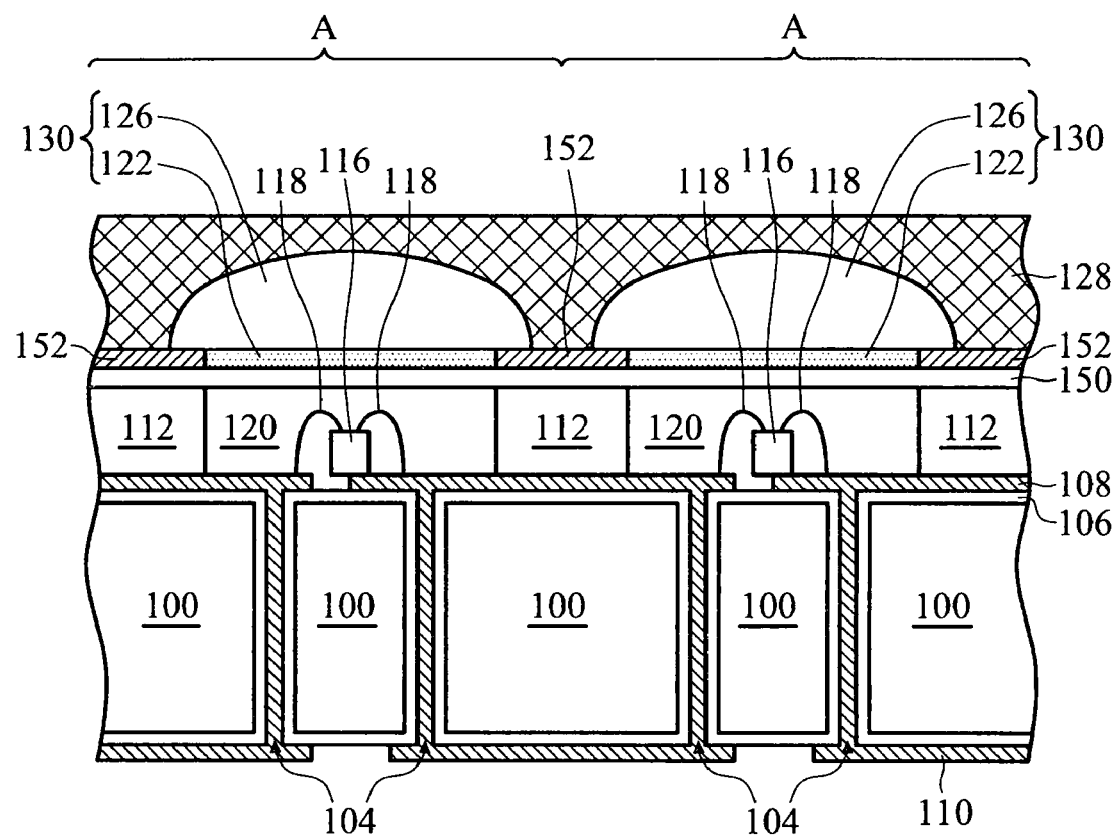
Figure 3D:
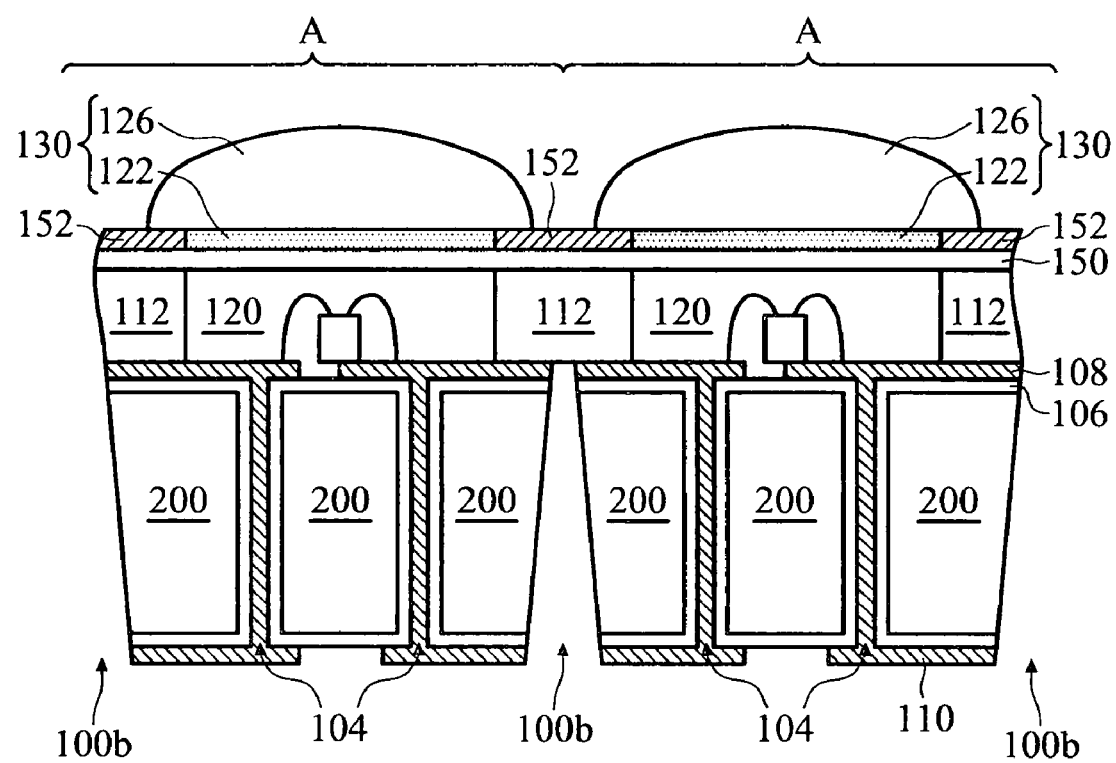
Figure 3E:
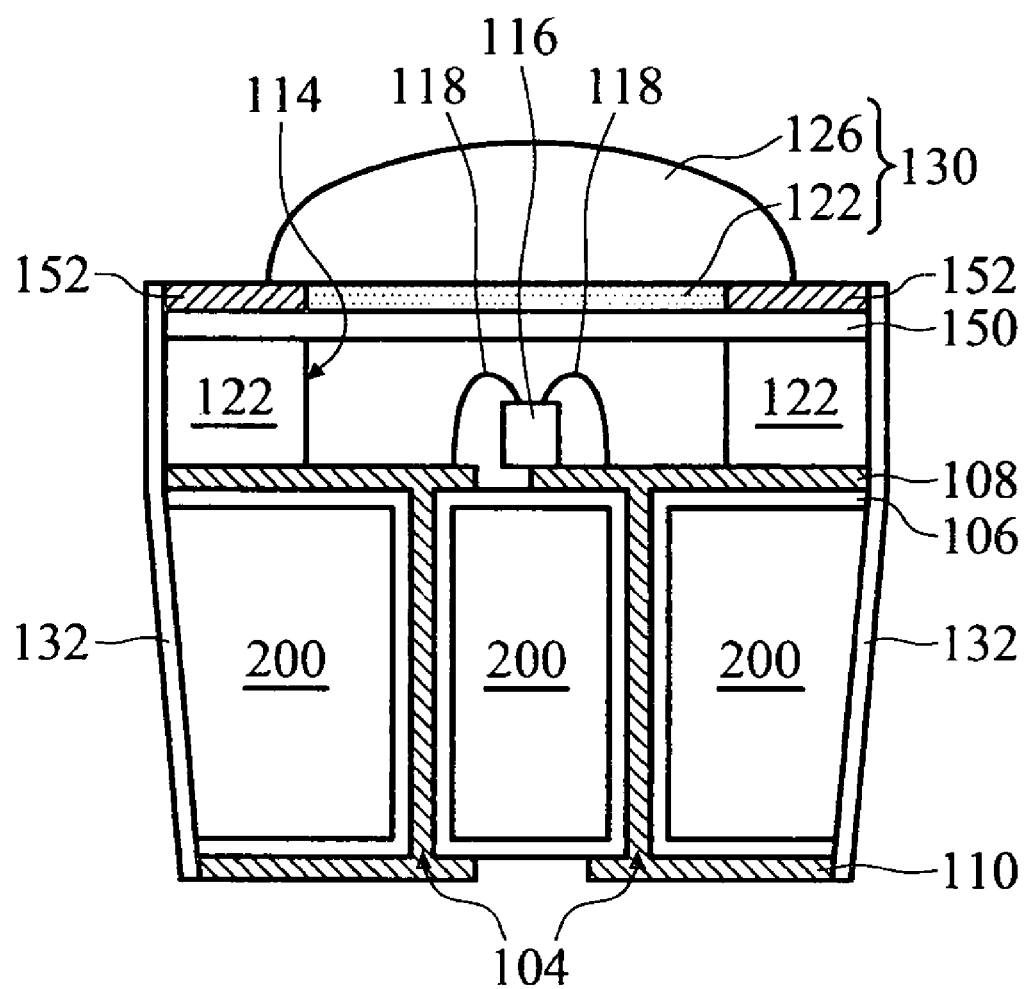
Figure 6A:
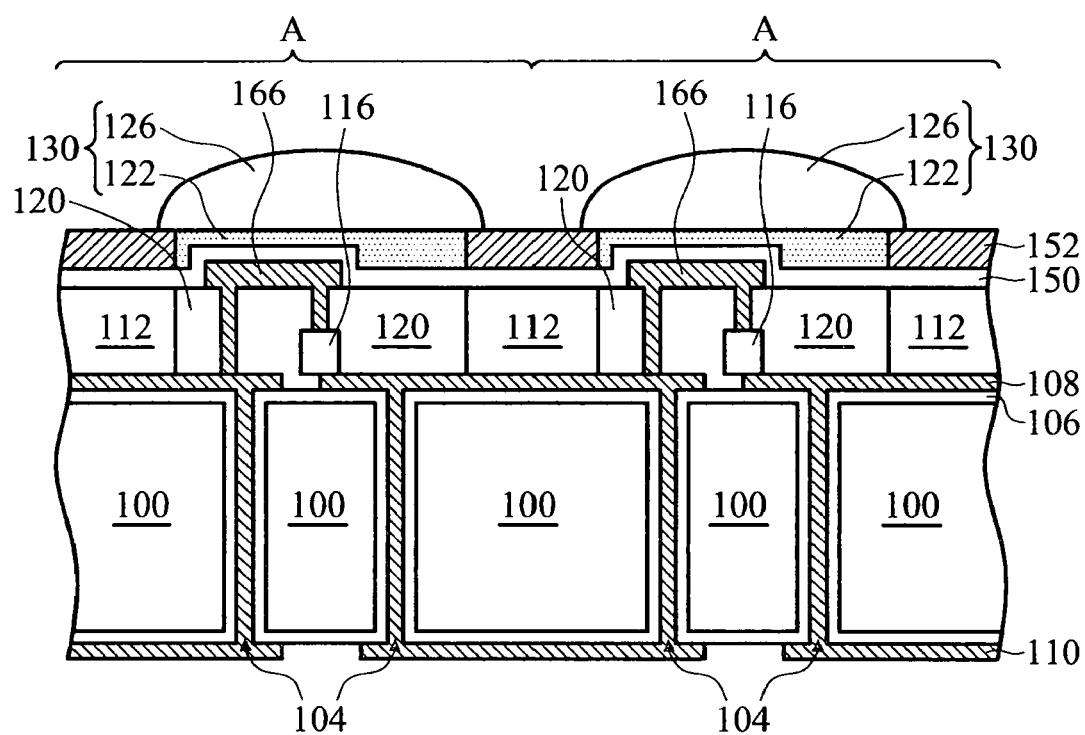
FIGS. 6A to 6B are cross sections of an exemplary embodiment of another method for fabricating LED devices according to the invention.
Figure 6B:
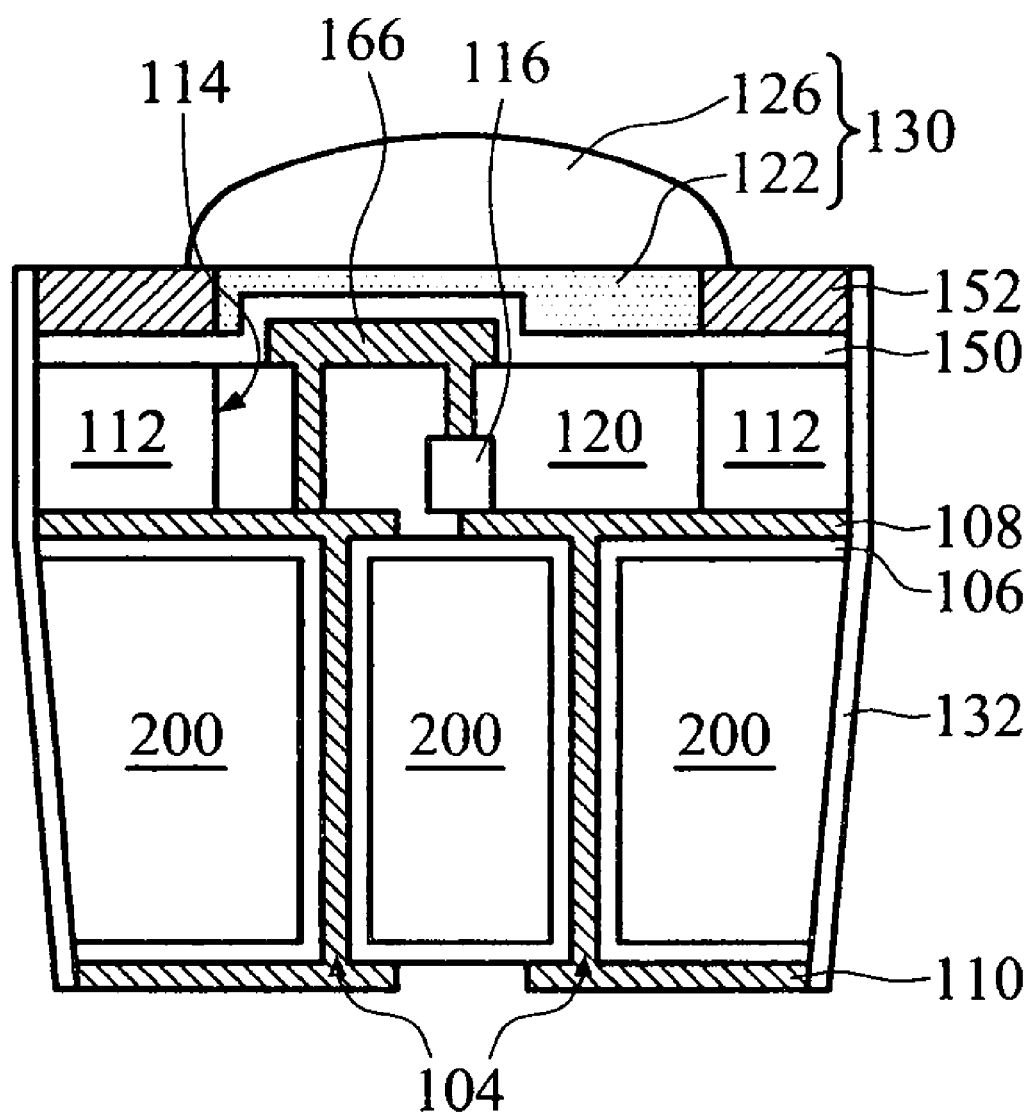

Referring to FIG. 3E and FIG. 6B, unlike the LED device shown in FIGS. 1I and 4D, the lens module 130 comprises a molded lens 126, and a fluorescent layer 122 formed by electrophoresis covered by the molded lens 126, both facing the LED chip 101.

Referring to FIGS. 1A to 1I, which are cross sections of an exemplary embodiment of a method for fabricating light-emitting diode (LED) devices according to the invention. As shown in FIG. 1A, a semiconductor substrate 100, such as a silicon wafer or other semiconductor wafers is provided. A plurality of adjacent device regions A is defined over an upper surface of the semiconductor substrate 100. At least two through holes 104 are formed trough the semiconductor substrate 100 in each device region A by, for example, a dry etching process (not shown). In order to simplify the diagram, only two adjacent device regions A with only two through holes 104, formed through the semiconductor substrate 100 therein, are depicted.

As shown in FIG. 1B, an insulating layer 106 such as a silicon oxide layer is conformally formed on the upper surface and the bottom surface of the semiconductor substrate 100, and on the sidewalls of each through holes 104 by, for example, a thermal oxidation, chemical vapor deposition (CVD) or other conventional deposition process. The thickness of the insulating layer 106 may be about 0.5~1.0 μm.

Referring to FIG. 1C, a first metal layer (not shown) is conformably formed on the insulating layer 106 overlying the top surface of the semiconductor substrate 100 and fills the upper portions of the through holes 104 by, for example, a sputtering process. The thickness of the first metal layer may be about 5~20 μm. Next, a second metal layer (not shown) is conformally formed on the insulating layer 106 overlying the bottom surface of the semiconductor substrate 100 and fills the lower portions of the through holes 104 by a sputtering process. The thickness of the second metal layer may be about 5~20 μm. As a result, the first metal layer is connected with the second metal layer by the through holes 104. Next, the first and the second metal layers are patterned by a photolithography and etching process (both not shown) to form patterned metal layers 108 and 110, respectively. Thus, at least two isolated inner wiring layers 108 are provided on the upper surface of the semiconductor substrate 100 in each device region A and at least two isolated outer wiring layers 110 are provided on the bottom surface of the semiconductor substrate 100 in each device region A. The metal layers 108 and 110 may comprise conductive materials such as aluminum (Al), copper (Cu) or alloys thereof.

Referring to FIG. 1D, a layer of insulating material (not shown) is blanketly formed over the upper surface of the semiconductor substrate 100, covering the metal layers 108 and the portion of the insulating layer 106 exposed by the metal layers 108. The layer of insulating material is then patterned by a photolithography and etching process (both not shown) and a plurality of patterned insulating layers 112 are formed on portions of the metal layers 108. These patterned insulating layers 112 define a space 114 in each device region A for disposing an LED chip (not shown). The patterned insulating layers 112 may comprise organic materials such as organic films comprising atoms such as C, O, Si, or H, and may have a thickness T of about 5~20 μm.

Referring to FIG. 1E, a plurality of light-emitting diode (LED) chips 116 are correspondingly provided in one of the spaces 114 defined by the insulating layer 112. Each of the LED chips 116 is electrically connected to the corresponding inner wiring layers 108 by wire bonding through wiring lines 118, respectively. A transparent encapsulating layer 120 comprising materials such as silicone base glue is then filled into the spaces 114 to entirely cover and protect the light-emitting diode chips 116 wire bonded over the corresponding inner wiring layers 108. As shown in FIG. 1E, the transparent encapsulating layer 120 formed between the spaces 114 defined by the insulating layer 112 is substantially coplanar with the adjacent insulating layer, thereby providing a planar top surface for sequential lens module fabrication.

Referring to FIG. 1F, a plurality of fluorescent layers 122, such as phosphor layers, is formed over the upper surface of the semiconductor substrate 100 by a mold 122 and arranged as an array. These molded fluorescent layers 122 correspond to one of the spaces 114 thereunder and are thus formed corresponding to one of the transparent encapsulating layers 120, respectively. Since the fluorescent layer 122 is formed by molding, and the underlying transparent encapsulating layer 120 and the insulating layer 112 provide a substantially planar surface, the profile of the fluorescent layer 12 can be easily controlled. In this embodiment, the central portion of the molded fluorescent layer 122 has a thickness thicker than that of the edge portion thereof.

Referring to FIG. 1G, after removal of the mold 124, a plurality of lenses 126 comprising moldable materials such as resin, inorganic glue, silicone base glue or UV glue is formed over the upper surface of the semiconductor wafer 100 corresponding to the fluorescent layers 122 by a mold 128. Each of the lenses 126 entirely covers a top surface of one of the fluorescent layers 122 thereunder and a portion of the insulating layer 112 adjacent thereto.

Referring to FIG. 1H, after removal of the mold 128, a plurality of lens modules 130 respectively comprising the lens 126 and the fluorescent layer 122 are provided over the LED chips 116, respectively. Next, the bottom surface of the semiconductor substrate 100, the overlying insulating layer 106, and the overlying metal layer 110 are successively etched to form a plurality of notches 100b between the adjacent spaces 114, thereby forming individual semiconductor substrates 200 and exposing a portion of bottom surfaces of the insulating layer 112, respectively.

Referring to FIG. 1I, the insulating layer 112 is cut from the plurality of notches 100b to form individual LED devices on the corresponding semiconductor substrate 200. An insulating layer 132 may be optionally formed to cover sidewalls of each semiconductor substrate 200 and insulating layer 112 thereon.

Referring to FIGS. 2A to 2C, which are illustrated cross sections of an exemplary method for fabricating LED devices modified by that illustrated in FIGS. 1A~1I, elements in FIGS. 2A to 2C that are the same as those in FIGS. 1A to 1I are labeled with the same reference numbers as in FIGS. 1A to 1I and are not described again for brevity.

Referring to FIG. 2A, a substantially fabricated semiconductor structure which is the same as that shown in FIG. 1E is first provided. A plurality of lenses 126 comprising moldable materials such as resin, inorganic glue, silicone base glue or UV glue is then formed over the upper surface of the substantially fabricated semiconductor structure by a mold 128. The lenses 126 correspond to one of the transparent encapsulating layer 120, respectively. Each of the lenses 126 covers the transparent encapsulating layer 120 and portions of the insulating layer 112 adjacent thereto in each device region A.

Referring to FIG. 2B, after removal of the mold 128, a plurality of fluorescent layers 122, such as phosphor layers, are correspondingly formed over the top surface of the lenses 126 and a portion of the insulating layer 112 adjacent thereto by a mold 124.

Referring to FIG. 2C, after removal of the mold 124, the processes disclosed in FIGS. 1H and 1I are then performed to the structure illustrated in FIG. 2B, thereby forming individual LED devices on the corresponding semiconductor substrate 200. An insulating layer 132 may be optionally formed to cover sidewalls of each semiconductor substrate 200 and insulating layer 112 thereon. In this embodiment, an LED device with a lens module 130 comprising an outer fluorescent layer 122 covering an inner lens 126 is provided over the LED chip 116 embedded in the transparent encapsulating layer 120.

Referring to FIGS. 3A to 3E, which are illustrated cross sections of an exemplary method for fabricating LED devices modified by that illustrated in FIGS. 1A~1I, elements in FIGS. 3A to 3C that are the same as those in FIGS. 1A to 1I are labeled with the same reference numbers as in FIGS. 1A to 1I and are not described again for brevity.

Referring to FIG. 3A, a substantially fabricated semiconductor structure which is the same as that shown in FIG. 1E is first provided. A transparent conductive layer 1501 comprising transparent conductive materials such as indium tin oxide (ITO), indium zinc oxide, is blanketly formed to cover the top surface of the insulating layer 112 and the transparent encapsulating layer 120.

Referring to FIG. 3B, a patterned passivation layer 152 comprising dielectric materials such as inorganic material is then formed on the portion the transparent conductive layer 150 overlying the insulating layer 112, thereby exposing the portion the transparent conductive layer 150 overlying the transparent encapsulating layer 120 with the LED chip 116 embedded therein. Next, an electrophoresis deposition process 154 is performed using the mixture as a precursor, isopropyl alcohol (IPA) as a carrier solution, and the transparent conductive layer 150 as a cathode. During the electrophoresis deposition process 154, magnesium nitrate ($Mg(NO_3)_2$) may be added into the mixture to increase the conductivity thereof. Additionally, a surface treatment can be optionally performed on the exposed transparent conducting layer 150 by acid washing, using a mixture of sulfuric acid ($H_2SO_4$) and hydrogen peroxide ($H_2O_2$), such that the surface of the portion of the transparent conducting layer 150 exposed by the passivation layer 152 has OH groups, which are advantageous for enhancing adhesion between the fluorescent material and the transparent conducting layer 150. After the electrophoresis deposition process 154 is completed, the fluorescent layer 122 is filled in a space defined by the patterned passivation layer 152 and overlying the transparent encapsulating layer 120. In this embodiment, the fluorescent layer 122 may comprise a plurality of phosphor particles (not shown) therein and the surface of each phosphor particle is covered by a gel (not shown) containing silicon dioxide ($SiO_2$) and aluminum oxide ($Al_2O_3$) to form a core-shell structure. In particular, the fluorescent layer 122 is formed with a top surface substantially coplanar with that of the passivation layer 152.

Referring to FIG. 3C, a plurality of lenses 126 comprising moldable materials such as resin, inorganic glue, silicone base glue or UV glue is next formed over the upper surface of structure shown in FIG. 3B by a mold 128 and correspond to one of the fluorescent layers 122, respectively. The lenses 126 cover the fluorescent layers 122 thereunder and portions of the passivation layer 152 adjacent thereto, respectively.

Referring to FIG. 3D, after removal of the mold 128, a plurality of lens modules 130 respectively comprising the lens 126 and the fluorescent layer 122 are completed and provided over one of the LED chips 116, respectively. Next, the bottom surface of the semiconductor substrate 100 and the overlying insulating layer 106 and metal layer 110 thereof are successively etched to form a plurality of notches 100b between the adjacent spaces 114 to form individual semiconductor substrates 200 and expose a portion of the bottom surfaces of the insulating layer 112.

Referring to FIG. 3E, the insulating layer 112, the transparent conductive layer 150 and the passivation layer 152 are cut from the plurality of notches 100b to form individual LED devices on the corresponding semiconductor substrate 200. An insulating layer 132 may be optionally formed to cover sidewalls of each semiconductor substrate 200 and insulating layer 112 thereon. In this embodiment, an LED device with a lens module 130 comprising a fluorescent layer 122 covering an inner lens 126 is provided over the LED chip 116 embedded in the transparent encapsulating layer 120. Since the fluorescent layer 122 is formed by an electrophoresis deposition process, improved thickness uniformity of the fluorescent layer 122 can be achieved.

Referring to FIGS. 4A to 4D, which are illustrated cross sections of an exemplary method for fabricating LED devices modified by that illustrated in FIGS. 1A~1I, elements in FIGS. 4A to 4D that are the same as those in FIGS. 1A to 1I are labeled with the same reference numbers as in FIGS. 1A to 1I and are not described again for brevity.

Referring to FIG. 4A, a substantially fabricated semiconductor structure similar to that shown in FIG. 1E is first provided. In this embodiment, the LED chips 116 are embedded in each of the transparent encapsulating layers 112 but are not wire bonded with the corresponding inner wiring layers 108. A photoresist layer 160 comprising photosenstive materials such as dry film photoresist or liquid photoresist is then blanketly formed to cover the top surface of the insulating layer 112 and the transparent encapsulating layer 120. The photoresist layer 160 is then patterned by a conventional photolithography and development processes (both not shown), thereby forming a plurality of openings 162 in the photoresist layer 160. As shown in FIG. 4A, two openings 162 are formed through the photoresist layer 160 in each device region A and portions of the transparent encapsulating layer 120 are exposed.

Referring to FIG. 4B, an etching process (not shown) is performed to etch portions of the transparent encapsulating layer 120 exposed by the openings 162 by using the photoresist layer 160 as an etching mask. After removal of the photoresist layer 160, two openings 164 are formed through the transparent encapsulating layer 120 in each device region A to expose a portion of one of the inner wiring layers 108 and a portion of the top surface of the LED chip 116, respectively. Next, a layer of conductive material such as aluminum (Al), copper (Cu) or alloys thereof is formed over the insulating layer 112 and the transparent encapsulating layer 120, and fills the openings 164. The layer of conductive material is then patterned by a photolithography and etching process (both not shown) to form a conductive redistribution layer 166 in each of the device region A. The redistribution layer 166 fills the openings 164 and electrically connects one of the inner wiring layers 108 and the LED chip 116.

Referring to FIG. 4C, a lens module 130 comprising an inner fluorescent layer 122 and an outer lens 126 is then respectively provided over the redistribution layer 166, and the insulating layer 112 and transparent encapsulating layer 120 adjacent thereto in each of the device region A. In this embodiment, the lens 126 and the fluorescent layer 122 of the lens module 130 are all fabricated according the processes disclosed in FIGS. 1F and 1G which respectively incorporate a mold 124 and 128.

Referring to FIG. 4D, the process disclosed in FIG. 1H is performed to the structure illustrated in FIG. 4C to thereby form individual LED devices on the corresponding semiconductor substrate 200. An insulating layer 132 may be optionally formed to cover sidewalls of each semiconductor substrate 200 and insulating layer 112 thereon. In this embodiment, an LED device with a lens module comprising the molded lens 126 and the molded fluorescent layer 122 is provided.

Referring to FIGS. 5A to 5B, which are illustrated cross sections of an exemplary method for fabricating LED devices modified by that illustrated in FIGS. 4A~4D, elements in FIGS. 5A and 5B that are the same as those in FIGS. 4A to 4D are labeled with the same reference numbers as in FIGS. 4A to 4D and are not described again for brevity.

Referring to FIG. 5A, a substantially fabricated semiconductor structure same as that shown in FIG. 4B is first provided. Next, the processes disclosed in FIGS. 2A-2C are performed to this substantially fabricated semiconductor structure and a lens module 130 comprising an inner lens 126 covered by an outer fluorescent layer 122 is provided over the conductive redistribution layer 166, and the insulating layer 112 and transparent encapsulating layer 120 adjacent thereto in each of the device region A.

Referring to FIG. 5B, the processes disclosed in FIGS. 1H and 1I are then performed to the structure illustrated in FIG. 5A, thereby forming individual LED devices on the corresponding semiconductor substrate 200. An insulating layer 132 may be optionally formed to cover sidewalls of each semiconductor substrate 200 and insulating layer 112 thereon. In this embodiment, an LED device with a lens module 130 comprising the fluorescent layer 122 formed outside of the lens 126 is provided.

Referring to FIGS. 6A to 6B, which are illustrated cross sections of an exemplary method for fabricating LED devices modified by that illustrated in FIG. 4A~4D, elements in FIGS. 6A and 6B that are the same as those in FIGS. 4A to 4D are labeled with the same reference numbers as in FIGS. 4A to 4D and are not described again for brevity.

Referring to FIG. 6A, a substantially fabricated semiconductor structure similar with that shown in FIG. 4B is first provided. Next, the processes disclosed in FIG. 3A-3D are performed to the structure shown in FIG. 4B. Thus, a lens module 130 comprising a fluorescent layer 122 formed by an electrophoresis deposition process and a molded lens 126 covering the fluorescent layer 122 is provided over the redistribution layer 166, and the insulating layer 112 and transparent encapsulating layer 120 adjacent thereto in each of the device region A.

Referring to FIG. 6B, the processes disclosed in FIGS. 3D and 3E are then performed to thereby form individual LED devices on the corresponding semiconductor substrate 200. An insulating layer 132 may be optionally formed to cover sidewalls of each semiconductor substrate 200 and insulating layer 112 thereon. In this embodiment, an LED device with a lens module comprising the fluorescent layer 122 formed by an electrophoresis deposition process and a molded lens 126 covering the fluorescent layer 122 is provided.

According to the aforementioned embodiments, the fluorescent layer and the lens of the lens module used in an LED device are not physically in contact with an LED chip and are spaced from thereto by an interlayer such as the transparent encapsulating layer or the transparent conductive layer. Compared to the conventional fluorescent layer filled around the LED chip, the conductive wire connection will not be broken or disconnected during formation of the fluorescent layer and the lens in the lens module, thereby ensuring reliability of a fabricated LED device and allowing difficulty of rework of the fluorescent layer and the lens in the lens module to decrease. Moreover, prior to formation the lens module, a planar or substantially planar surface is provided, thus allowing the fluorescent layer and the lens in the lens module on the surface to be formed by molding methods. The fluorescent layer in the lens module can be also formed by electrophoresis. Compared to the conventional fluorescent layer filled around an LED chip, thickness uniformity and shape of the fluorescent material and the lens material can be well controlled or even improved. Moreover, since the fluorescent layer and the lens of the lens module are formed and the LED devices are packaged by a wafer level package, high production rate can be obtained and manufacturing costs can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode (LED) device, comprising:
a semiconductor substrate with a planar top surface;
a light-emitting diode (LED) chip disposed over the planar top surface of the semiconductor substrate;
two isolated outer wiring layers formed through the semiconductor substrate and electrically connected to the light-emitting diode chip, serving as input terminals;
a transparent encapsulating layer formed over the semiconductor substrate, capping the LED chip and the two isolated outer wiring layers;
an insulating layer formed over the semiconductor substrate, surrounding the transparent encapsulating layer and covering the two isolated outer wiring layers, wherein the insulating layer is coplanar with the transparent encapsulating layer;

a conductive redistribution layer formed through the transparent encapsulating layer and formed over a portion of a top surface of the transparent encapsulating layer, electrically connecting the light-emitting diode chip with the isolated outer wiring layers; and a lens module adhered to the conductive redistribution layer, the insulating layer and the transparent encapsulating layer to cap the light-emitting diode chip, comprising:

a fluorescent layer; and a lens covering or covered by the fluorescent layer.

2. The LED device of claim 1, wherein the fluorescent layer is a molded fluorescent layer, the lens is a molded lens, and the lens covers the fluorescent layer.

3. The LED device of claim 1, wherein the fluorescent layer is a molded fluorescent layer, the lens is a molded lens, and the lens is covered by the fluorescent layer.

4. The LED device of claim 1, wherein the fluorescent layer is formed by an electrophoresis, the lens is a molded lens, and the lens covers the fluorescent layer.

5. The LED device of claim 4, wherein the fluorescent layer is formed with a planar top surface.

6. The LED device of claim 1, further comprising at least two isolated inner wiring layers disposed over the planar top surface of the semiconductor substrate and, electrically connecting between the light-emitting diode chip and the isolated outer wiring layers.

7. The LED device of claim 6, wherein the semiconductor substrate comprises at least two through openings under the planar surface of the semiconductor substrate, such that the outer wiring layers are electrically connected to the inner wiring layers by the through openings, respectively.

8. The LED device of claim 1, wherein the transparent encapsulating layer comprises silicone gel.

* * * * *